(12) United States Patent
Mueller et al.

(10) Patent No.: US 11,605,667 B2
(45) Date of Patent: Mar. 14, 2023

(54) COMPONENT WITH ELECTRICALLY CONDUCTIVE CONVERTER LAYER

(71) Applicant: OSRAM OLED GmbH, Regensburg (DE)

(72) Inventors: Vesna Mueller, Vaterstetten (DE); David O'Brien, Portland, OR (US)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/977,815

(22) PCT Filed: Feb. 26, 2019

(86) PCT No.: PCT/EP2019/054720
§ 371 (c)(1),
(2) Date: Sep. 3, 2020

(87) PCT Pub. No.: WO2019/170473
PCT Pub. Date: Sep. 12, 2019

(65) Prior Publication Data
US 2020/0403027 A1 Dec. 24, 2020

(30) Foreign Application Priority Data
Mar. 5, 2018 (DE) .................. 10 2018 104 993 U

(51) Int. Cl.
*H01L 33/38* (2010.01)
*H01L 33/50* (2010.01)
*H01L 27/15* (2006.01)

(52) U.S. Cl.
CPC .................. *H01L 27/15* (2013.01)

(58) Field of Classification Search
None
See application file for complete search history.

(56) References Cited

U.S. PATENT DOCUMENTS

| 7,838,876 B2 | 11/2010 | von Malm | |
|---|---|---|---|
| 2007/0080361 A1* | 4/2007 | Malm | B82Y 30/00 257/99 |

(Continued)

FOREIGN PATENT DOCUMENTS

| DE | 102011056888 A1 | 6/2013 |
|---|---|---|
| DE | 102014112551 A1 | 3/2016 |

(Continued)

OTHER PUBLICATIONS

International Search Report issued in the International Patent Application No. PCT/EP2019/054720, dated May 24, 2019, 14 pages (for reference purposes only).

*Primary Examiner* — Bilkis Jahan
(74) *Attorney, Agent, or Firm* — Viering, Jentschura & Partner mbB

(57) ABSTRACT

A component may include a semiconductor body and a converter layer. The converter layer may have phosphor particles and an electrically conductive matrix material where the phosphor particles are embedded in the matrix material. The converter layer may be arranged on the semiconductor body and may have a plurality of sublayers that are spatially set apart from one another and can be electrically contacted individually. The semiconductor body may have an active zone for producing electromagnetic radiation where the sublayers of the converter layer are designed for local electrical contacting of the active zone.

17 Claims, 8 Drawing Sheets

(56) References Cited

U.S. PATENT DOCUMENTS

| | | | | |
|---|---|---|---|---|
| 2007/0164304 A1* | 7/2007 | Takeuchi | ............... | H01L 33/14 257/103 |
| 2008/0042153 A1* | 2/2008 | Beeson | ................ | H05B 33/10 257/E33.001 |
| 2010/0148200 A1* | 6/2010 | Lai | ...................... | H01L 33/508 257/E33.061 |
| 2015/0014716 A1* | 1/2015 | von Malm | ............ | H01L 33/62 257/89 |
| 2015/0340574 A1* | 11/2015 | Tamaki | ................ | H01L 24/97 257/98 |
| 2016/0266459 A1* | 9/2016 | Oh | ........................ | G02F 1/155 |
| 2017/0309794 A1 | 10/2017 | Von Malm | | |

FOREIGN PATENT DOCUMENTS

| | | |
|---|---|---|
| EP | 1770794 A2 | 4/2007 |
| JP | 2007214302 A | 8/2007 |
| JP | 4275701 B2 | 6/2009 |
| KR | 20130065326 A | 6/2013 |
| WO | 2006049146 A1 | 5/2006 |

\* cited by examiner

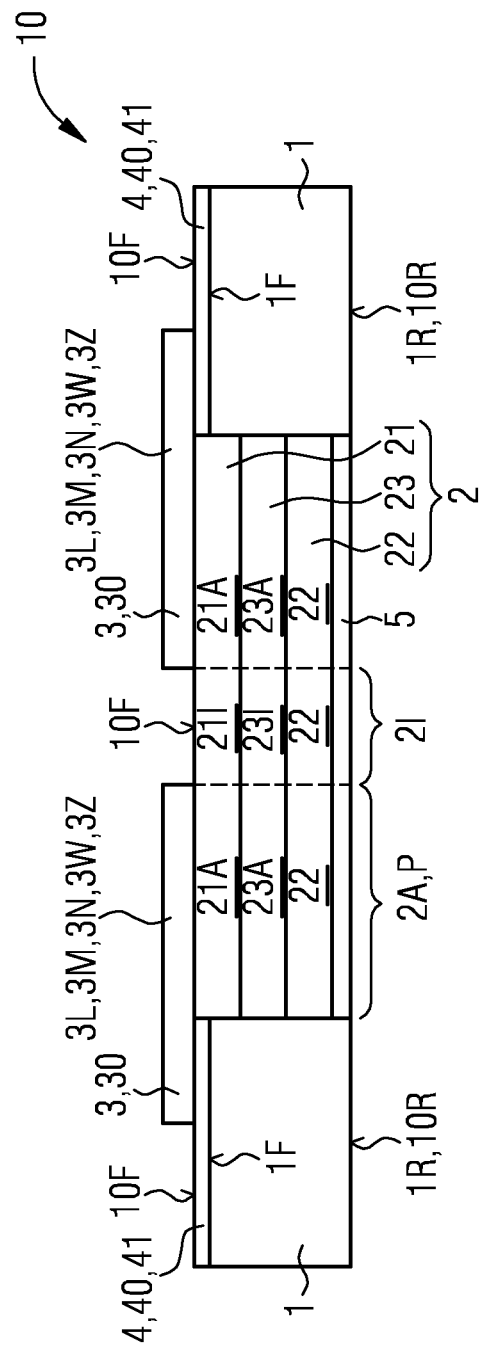

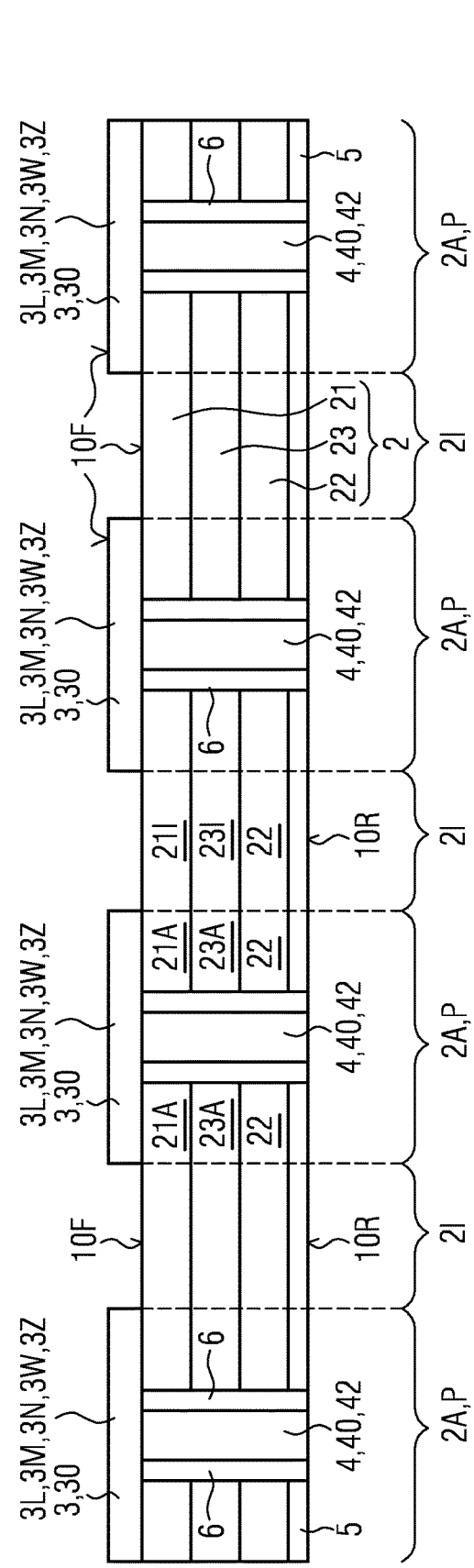

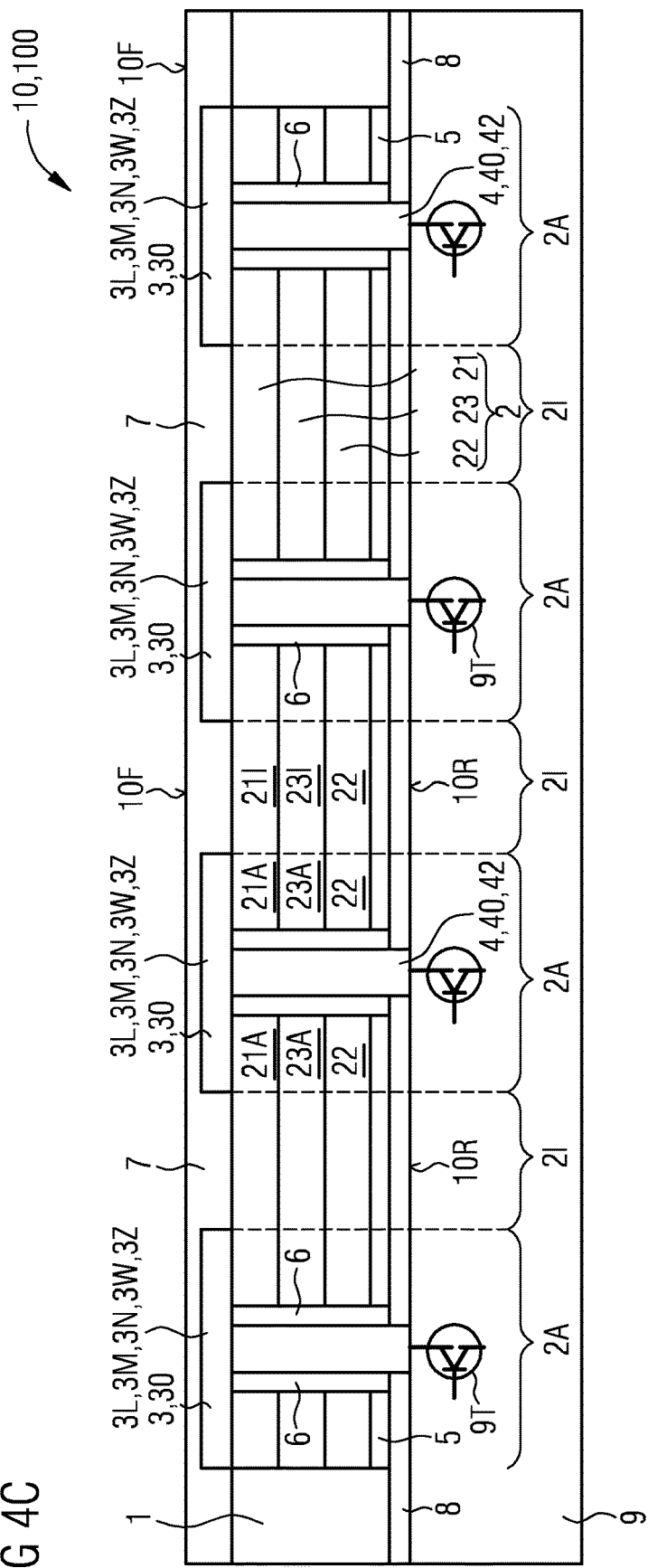

COMPONENT WITH ELECTRICALLY CONDUCTIVE CONVERTER LAYER

CROSS-REFERENCE TO RELATED APPLICATIONS

The present application is a national stage entry according to 35 U.S.C. § 371 of PCT application No.: PCT/EP2019/054720 filed on Feb. 26, 2019; which claims priority to German Patent Application Serial No.: 10 2018 104 993.5 filed on Mar. 5, 2018; all of which are incorporated herein by reference in their entirety and for all purposes.

Technical Field

A component with an electrically conductive converter layer is specified. In addition, a method for producing such a component is specified.

Background

Light-emitting components which are used in the display of pixels usually have a small light-emitting surface. One of the challenges is electrically contacting the light-emitting components while avoiding shadowing effects as much as possible. The electrical contacting of such light-emitting components is also complicated by the presence of possible converter layers on the radiation exit sides of the components.

Summary

One object of a non-limiting embodiment is to specify a compact light-emitting component for displaying a pixel or a plurality of pixels. A further object of a non-limiting embodiment is to specify a method for producing such a component.

These objects are achieved by a component according to the independent claim and/or in conjunction with such a component. Further designs and refinements of the component or the method are the subject matter of the additional claims.

According to at least one embodiment of a component, it includes a semiconductor body and a converter layer. The semiconductor body has, for example, an active zone for generating electromagnetic radiation. In particular, the converter layer is designed to convert the electromagnetic radiation of a first peak wavelength generated by the active zone into electromagnetic radiation of a second peak wavelength. In particular, the first peak wavelength is shorter than the second peak wavelength. For example, the first peak wavelength differs from the second peak wavelength by at least 30 nm, 50 nm, 100 nm, 200 nm, or at least 300 nm. The converter layer is configured to convert UV light or blue light into red, green or yellow light.

According to at least one embodiment of the component, the converter layer has fluorescent particles and an electrically conductive matrix material. In particular, the fluorescent particles are embedded in the matrix material. The electrically conductive matrix material may be a radiation-permeable and electrically conductive material or contain such a material. The fluorescent particles have an average particle size of, in particular, between 1 nm and 50 μm inclusive, for example between 1 μm and 30 μm inclusive, approximately between 5 μm and 30 μm. The fluorescent particles may be nanofluorescent particles, which have an average particle size between 1 nm and 1 μm inclusive, between 1 nm and 500 nm inclusive, between 1 nm and 300 nm inclusive, in particular between 1 nm and 100 nm inclusive.

The fluorescent particles can be particles of an organic dye substance or an inorganic dye substance. In a non-limiting embodiment, the converter layer includes particles of at least one of the following dye substances: garnets with rare earth metal dopants, alkaline earth sulfides with rare earth metal dopants, thiogallates with rare earth metal dopants, aluminates with rare earth metal dopants, orthosilicates with rare earth metal dopants, chlorosilicates with rare earth metal dopants, alkaline earth silicon nitrides with rare earth metal dopants, oxynitrides with rare earth metal dopants, aluminum oxynitrides with rare earth metal dopants. The converter layer includes doped grenades such as Ce- or Tb-activated garnets such as YAG:Ce, TAG:Ce, TbYAG:Ce. The fluorescent particles can be quantum dots. For example, the quantum dots are semiconductor nanocrystals, for example of III-V or II-VI compound semiconductor materials or of Si-based materials. In particular, the fluorescent particles include CdSe, CdTe, CdS, ZnS and/or ZnO. For example, the CdSe, CdS and/or CdTe particles are embedded as quantum dots in a material such as CdS, ZnS and/or ZnO.

According to at least one embodiment of the component, the converter layer is arranged on the semiconductor body and structured in such a way that the converter layer has a plurality of spatially separated sub-layers that can be individually electrically contacted. The sub-layers of the converter layer are configured for the local electrical contacting of the active zone of the semiconductor body.

The active zone of the semiconductor body can be implemented in a coherent manner overall, in such a way that a plurality of sub-layers of the converter layer are configured for the local electrical contacting of different sub-regions of the same active zone. In the operation of the component, the coherent active zone can have at least one radiation-inactive sub-region and a plurality of radiation-active sub-regions. Each of the radiation-active sub-regions of the contiguous active zone can be individually electrically contacted by one of the sub-layers of the converter layer. The sub-layers of the converter layer can have the same electrically conductive matrix material or different electrically conductive matrix materials. Two or more sub-layers of the converter layer may have the same fluorescent substance composition or different fluorescent substance compositions.

In at least one embodiment of a component, it includes one semiconductor body and one converter layer. The converter layer includes fluorescent particles and an electrically conductive matrix material, the fluorescent particles being embedded in the matrix material. The converter layer is arranged on the semiconductor body and includes a plurality of spatially separated sub-layers that can be individually electrically contacted. The semiconductor body has an active zone for generating electromagnetic radiation, wherein the sub-layers of the converter layer are configured for the local electrical contacting of the active zone.

On the one hand, the converter layer is designed to be electrically conductive, wherein the sub-layers of the converter layer are configured for electrically contacting different sub-regions of the, in particular coherent, active zone of the semiconductor body. On the other hand, the sub-layers of the converter layer may include different fluorescent compositions, so that the electromagnetic radiation generated by the same active zone from the different sub-layers of the converter layer can be converted into electromagnetic radiations of different peak wavelengths. In this sense, the converter layer is electrically conductive and structured at the same time, so that the active zone can be locally activated. Different groups of the sub-layers of the converter layer with the semiconductor body underneath it can be used to display a pixel, or a plurality of pixels or groups of pixels.

According to at least one embodiment of the component, it lacks a current spreading layer between the converter layer and the semiconductor body. The sub-layers of the converter layer thus act in particular as local lateral current spreading layers for the semiconductor body. The component also lacks a further current expansion layer arranged vertically between the converter layer and the semiconductor body.

Due to the comparatively poor cross-conductivity of the semiconductor body and the absence of a contiguous, roughly planar current spreading layer arranged between the converter layer and the semiconductor body, the semiconductor body, in particular the active zone of the semiconductor body, can be electrically contacted locally via the sub-layers of the converter layer. It is thus possible to ensure that a sub-region of the active zone is made to emit light by electrical contacting of the corresponding sub-layer of the converter layer, while other, in particular adjacent, sub-regions of the active zone, which are not electrically activated by other sub-layers of the converter layer, remain inactive.

A lateral direction is understood to mean a direction that runs, in particular, parallel to a main extension surface of the component, in particular of the converter layer. A vertical direction is understood to mean a direction that is oriented, in particular, perpendicular to the main extension surface of the component and/or the converter layer. The vertical direction and the lateral direction are approximately orthogonal to each other.

According to at least one embodiment of the component, the converter layer is arranged directly on the semiconductor body. The converter layer with the sub-layers can be in direct physical contact with the semiconductor body. The converter layer is used in particular both for contacting the semiconductor body and for converting the electromagnetic radiation generated by the active zone during the operation of the component.

According to at least one embodiment of the component, each of the sub-layers of the converter layer is an integrally formed layer. Each of the sub-layers is, in particular, electrically insulated from the other sub-layers of the converter layer. The different sub-layers can contain different fluorescent substances. It is possible that some of the sub-layers have the same fluorescent substances or the same fluorescent substance composition. For example, multiple sub-layers, such as three or four adjacent sub-layers of the converter layer, have different fluorescent substances or fluorescent substance compositions, wherein the adjacent sub-layers of the converter layer are configured to display a pixel or a group of pixels.

According to at least one embodiment of the component, the converter layer has at least three or four sub-layers with different types of fluorescent particles or with different fluorescent compositions, the at least three or four sub-layers covering the same active zone of the semiconductor body in plan view. The active zone can be coherent. For example, the active zone has a plurality of sub-regions or a single coherent sub-region, which is not covered by the converter layer in plan view and is not configured to generate electromagnetic radiation in the operation of the component.

According to at least one embodiment of the component the fluorescent particles have an average particle size between 1 nm and 1 µm inclusive, for example between 1 nm and 500 nm or between 1 nm to 100 nm inclusive or between 1 nm and 10 nm inclusive. The average particle size is, in particular, a mean value of the diameters or the spatial extension of the fluorescent particles. The fluorescent particles can be implemented as quantum dots, which in particular have an average particle size of less than 10 nm, for example, less than 5 nm, or less than 3 nm. For example, the fluorescent particles implemented as quantum dots have an average particle size between 1 nm and 10 nm inclusive.

According to at least one embodiment of the component, in the operation of the component the active zone has at least one radiation-inactive sub-region and a plurality of radiation-active sub-regions, wherein in plan view of the semiconductor body the converter layer and the radiation-inactive sub-region do not overlap. The radiation-active subregions are, in particular, covered by the sub-layers of the converter layer.

In the operation of the component, the radiation-active sub-regions of the active zone are in particular those sub-regions of the semiconductor body that are electrically contacted by the sub-layers of the converter layer and generate electromagnetic radiation. By contrast, the radiation-inactive sub-region or the plurality of radiation-inactive sub-regions of the active zone is/are not covered by the converter layer in plan view, and due to the poor cross-conductivity of the semiconductor body is/are not, or not substantially, electrically conductively connected to the sub-layers of the converter layer. In the radiation-inactive sub-region of the active zone therefore, no or hardly any electromagnetic radiation is generated during the operation of the component.

According to at least one embodiment of the component, the radiation-inactive sub-region and the radiation-active sub-regions are adjacent regions of the same contiguously formed active zone of the semiconductor body. In plan view of the semiconductor body, the radiation-active sub-regions are isolated from each other, in particular spatially and electrically isolated from each other, in particular by the radiation-inactive sub-regions or by a single, coherent radiation-inactive subregion of the active zone.

It is possible that each of the radiation-active sub-regions of the active zone forms a pixel of the component with the corresponding sub-layer of the converter layer. The radiation-active sub-regions or all radiation-active sub-regions may be implemented as components of the same coherent active zone of the semiconductor body. In particular, the radiation-inactive sub-region of the semiconductor body is also part of the coherent active zone of the semiconductor body. The radiation-active subregions and the radiation-inactive subregion or the radiation-inactive sub-regions of the active zone are, in particular, directly adjacent to each other.

According to at least one embodiment of the component, the semiconductor body has a first semiconductor layer and a second semiconductor layer, the active zone being arranged in the vertical direction between the first semiconductor layer and the second semiconductor layer. For example, the first semiconductor layer is n-type, in particular n-conducting and/or n-doped. The second semiconductor layer can be p-type, such as p-conducting or p-doped.

In a non-limiting embodiment, the first semiconductor layer is arranged in the vertical direction between the converter layer and the active zone. The converter layer with the sub-layers can be directly adjacent to the first semiconductor layer. In a plan view of the semiconductor body, the converter layer covers the first semiconductor layer in some regions. In particular, electrical charge carriers are injected from the sub-layers of the converter layer into the corresponding sub-regions of the semiconductor body or of the first semiconductor layer only in the overlap regions between the converter layer and the semiconductor body. Due to the comparatively poor cross-conductivity of the n-type semiconductor layer, no electrical charge carriers are injected into the sub-regions of the first semiconductor layer which in plan view have no overlaps with the converter layer or with the sub-layers of the converter layer. In this way, the underlying active zone can be divided into radiation-active sub-regions and radiation-inactive sub-region or sub-regions.

The radiation-active sub-regions of the active zone can each be electrically contacted individually via one of the sub-layers of the converter layer and can therefore be individually activated. The converter layer can be designed as part of a first electrode of the component, the first electrode having a plurality of sub-contact layers formed by the sub-layers of the converter layer.

The component can have a second electrode which is configured in particular for the electrical contacting of the second semiconductor layer of the semiconductor body. Unlike the first electrode, the second electrode can be contiguously designed.

According to at least one embodiment of the component the matrix material contains a radiation-permeable and electrically conductive oxide (TCO), or is formed or consists of such a material. For example, the matrix material is formed from a metal oxide, for example zinc oxide such as ZnO, or from tin oxide, such as $SnO_2$. Other possible metal oxides are $CdSnO_3$, $In_2O_3$, $Zn_2SnO_4$, $ZnSnO_3$, $MgIn_2O_4$, $GaInO_3$, $Zn_2In_2O_5$, $In_4Sn_3O_{12}$, or mixtures thereof.

It is possible that the radiation-permeable and electrically conductive materials are present in the converter layer in the form of particles, in particular, in the form of nanoparticles. It is also possible that the particles or the nanoparticles of the radiation-permeable and electrically conductive material are mixed or doped with at least one of the following materials, namely: boron, aluminum, gallium, indium, silicon, magnesium and/or cadmium. These materials can be present in the form of particles or nanoparticles of a matrix material. It is possible that the matrix material is a silicone material with TCO particles embedded therein, wherein a concentration of the TCO particles and/or the embedded electrically conductive particles is selected in such a way that the matrix material is electrically conductive overall.

According to at least one embodiment of the component, the converter layer includes metallic additive particles, which are embedded in the matrix material, in particular to increase the electrical conductivity of the converter layer. Such metallic additive particles may be made of copper, aluminum, silver, gold or iron. The additive particles can be 0D, 1D or 2D nanomaterials, i.e. point-like, thread-like or laminar, in particular graphene-like, nanomaterials. For example, the additive particles are present in the form of threads, microthreads or nanothreads, in particular in the form of metallic nanothreads.

According to at least one embodiment of the component, the converter layer includes organic and/or inorganic additive particles, which are embedded in the matrix material in order to reduce internal mechanical stresses in the converter layer. The organic and/or inorganic additive particles can be formed of a material having a higher ductility than the matrix material of the converter layer. The use of such additive particles, for example of a polymer, can increase the toughness, for example the cracking resistance, or the extensibility of the converter layer or the sub-layers of the converter layer.

According to at least one embodiment of the component, the converter layer includes additional particles, which are embedded in the matrix material, in particular, to adjust the degree of reflectivity and/or permeability of the converter layer. The additional particles may be formed from a material, the refractive index of which is higher than a refractive index of the matrix material, for example larger by 0.1, 0.2 or 0.5. For example, the difference between the refractive indices is between 0.1 and 1.5 inclusive.

The additional particles may be radiation-reflecting particles with a refractive index of at least 1.8 or 2.0 or 2.5, for example between 1.8 and 3.0 inclusive. In particular, the additional particles are oxide particles, such as titanium oxide particles and/or zirconium oxide particles, such as $TiO_2$ and/or $ZrO_2$ particles. Zirconium oxide has a refractive index of approximately 2.0 to 2.3 and can be transparent at the same time. Depending on the desired degree of reflection and/or permeability of the converter layer, the proportion of additional particles in the converter layer can be between 0 and 90 percent by volume and/or weight. The degree of permeability can be adjusted by the particle size of the additional particles. If a high degree of permeability is desired, the additional particles may be adjusted such that these or a specified proportion of these additional particles have a particle size which is smaller than the wavelengths of the visible light. The additional particles are, in particular, nanoparticles made of titanium oxide, for example titanium dioxide, and/or zirconium oxide, for example zirconium dioxide.

According to at least one embodiment of the component, it has a first electrode on its front main surface and a second, in particular, common electrode on its rear main surface. The first electrode and the second electrode can be electrically contacted, in particular on different main surfaces of the component. The first electrode has, for example, a plurality of planar individual contact layers, each of which is electrically conductively connected to one of the sub-layers of the converter layer. The sub-layers of the converter layer can be individually electrically contacted, in particular via the contact layers of the first electrode. In other words, the sub-layers of the converter layer can be electrically contacted with an external voltage source via one of the contact layers of the first electrode in each case. The sub-layers of the converter layer can be regarded as components of the first electrode.

According to at least one embodiment of the component, the component has a first electrode and a second electrode on its main surface, which faces away from the converter layer. The first electrode and the second electrode are arranged in particular on the same main surface of the component and can be electrically contacted on the same main surface of the component. For example, the second electrode is a common electrode of the component and is configured, for example, for the electrical contacting of the second semiconductor layer of the semiconductor body.

The first electrode can have a plurality of vias, each extending from the main surface, for example the rear main surface, through the second electrode and the semiconductor body to one of the sub-layers of the converter layer. Each of the vias is electrically conductively connected to one, in particular to exactly one, of the sub-layers of the converter layer, and vice versa. Along the vertical direction, the via can extend through the second electrode, the second semiconductor layer, the active zone, and the first semiconductor layer of the semiconductor body. A sub-region of the first semiconductor layer and/or a sub-region of the active zone can be electrically contacted individually by the via and its associated sub-layer of the converter layer. By means of a plurality of vias of the first electrode and sub-layers of the converter layer, different sub-regions, in particular different radiation-active sub-regions, of the active zone can be individually electrically activated.

In at least one display device, this has a component, such as a component described here. In particular, a sub-region of the semiconductor body and a group consisting of at least three sub-layers of the converter layer form a pixel group of the display device, the pixel group being configured in particular to display an image point with any desired chromaticity coordinate. For example, the pixel group is an RGB pixel group or a CMYK pixel group.

It is possible that a further sub-region of the semiconductor body and a further group of at least three additional sub-layers of the converter layer form an additional pixel group of the display device for displaying any desired chromaticity coordinate, wherein the sub-region and the additional sub-region of the semiconductor body are in particular designed contiguously. In other words, the sub-region and the additional sub-region of the semiconductor body may be designed contiguously.

According to at least one embodiment of the component, this is an LED with a converter layer arranged thereon having the sub-layers. The component can have a single coherent active zone, wherein the sub-layers of the converter layer together with the semiconductor body form a plurality of pixel groups. Each of the pixel groups may include a plurality of pixels, for example, three or four pixels, each pixel being in particular uniquely assigned to one of the sub-layers of the converter layer. The component can have a plurality of pixel groups, such as at least 10, 100, 1000, or 10,000 such pixel groups.

In at least one embodiment of a method for producing a component, in particular a component described here, the converter layer is produced by a sol-gel process. For example, a sol including a radiation-permeable and electrically conductive matrix material and fluorescent particles is provided. To form the converter layer, a sol layer consisting of the sol is applied to the semiconductor body. The sol layer is then thermally treated, so that the sol is transformed into a gel. The sol layer can be applied to the semiconductor body by one of the following coating methods: spraying, immersion, rotational coating, screen printing, spreading by blade, jet printing, inkjet printing, or brushing. For example, the converter layer can be structured into a plurality of sub-layers in a subsequent process step. Alternatively, it is possible that the converter layer is applied to the semiconductor body in a structured manner. A printing method and/or a lithographic process, for example, are suitable for this purpose.

The converter layer, or the plurality of the sub-layers of the converter layer, includes in particular a sol-gel material. This means that when the converter layer is being applied to the semiconductor body, the material of the converter layer is in a sol state, for example. For example, the sol includes a solvent and electrically conductive particles and/or electrically conductive nanoparticles, which are contained in the solvent. In particular, the sol or the solvent may include titanium oxide particles and/or zirconium oxide particles, such as $TiO_2$ and/or $ZrO_2$ particles. In addition, the sol contains the fluorescent particles. After applying the sol to the semiconductor body, the sol is destabilized to form a gel by removing the solvent, for example. In this way, a gel layer is formed on the semiconductor body, which layer contains electrically conductive particles, in particular electrically conductive nanoparticles and fluorescent particles. By thermal treatment of the gel at temperatures between 80 degrees Celsius and 400 degrees Celsius, such as between 150 degrees Celsius and 400 degrees Celsius, or between 200 degrees Celsius and 400 degrees Celsius, or between 80 degrees Celsius and 200 degrees Celsius, a glass-like layer with a lower electrical layer resistance than the original gel layer can be formed.

If the fluorescent particles are not in the nanometer range, for example, but in the micrometer range, a contour of the converter layer can be defined by the contours of the fluorescent particles. The sol-gel material can impart an adhesive bond between a radiation exit surface of the component and the fluorescent particles. It is possible that the fluorescent particles have a mean diameter that is larger than a mean vertical layer thickness of the converter layer.

The method described here is particularly suitable for producing a component described here. The features described in connection with the component can therefore also be applied to the method and vice versa. In particular, other particles of the converter layer can be contained in the sol layer.

BRIEF DESCRIPTION OF THE FIGURES

Further advantageous embodiments and refinements of the component and the method are obtained from the non-limiting embodiments, described hereafter in connection with FIGS. 1A to 4C. In the figures:

FIGS. 1A and 1B show an embodiment of a component in a sectional view and in a plan view of a front side of the component, FIGS. 2A, 2B and 2C show a further embodiment of a component in a sectional view and in plan view of a front side and a rear side of the component, FIGS. 4A, 4B and 4C show schematic representations of various embodiments of a component or a display arrangement.

DETAILED DESCRIPTION

Figure 1B:
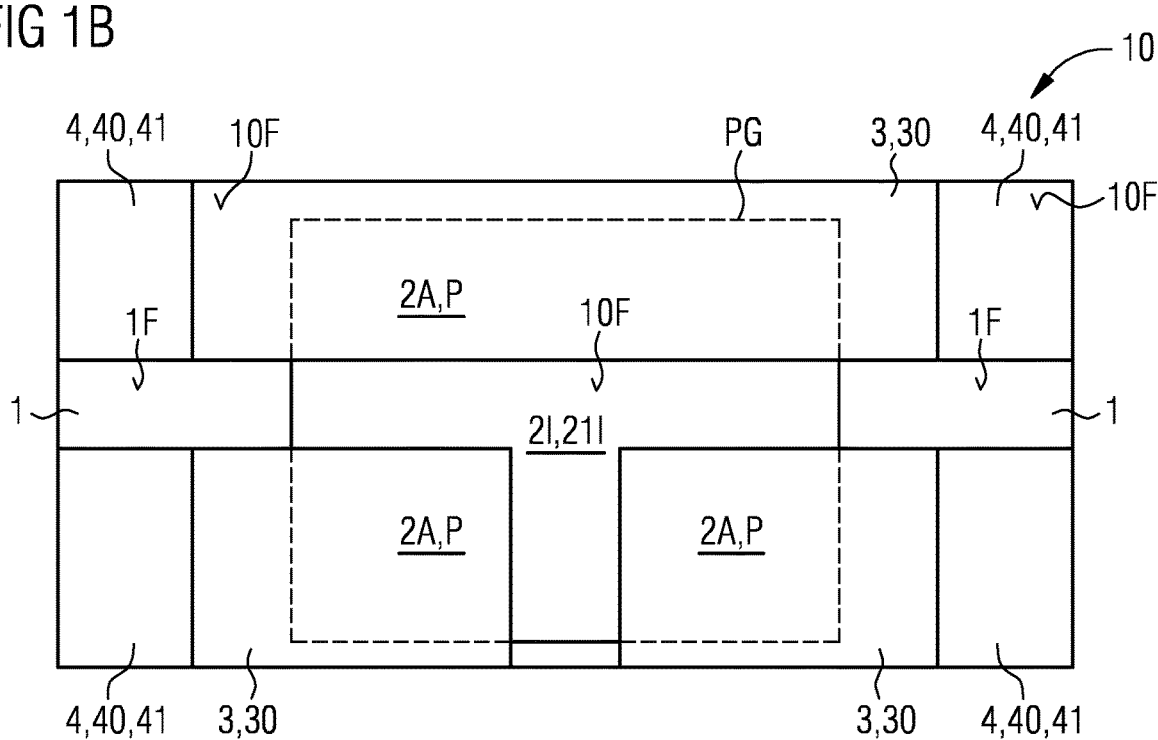

Identical, similar or equivalently functioning elements are labelled with identical reference signs in the figures. The figures are all schematic representations and therefore not necessarily true to scale. Rather, comparatively small elements and, in particular, layer thicknesses can be displayed excessively large for clarity.

In FIG. 1A, a component 10 is shown schematically in a sectional view. The component 10 has a semiconductor body 2 and a converter layer 3. The semiconductor body 2 has a first semiconductor layer 21 of a first charge carrier type and a second semiconductor layer 22 of a second charge carrier type, wherein an active zone 23 is arranged in the vertical direction between the first semiconductor layer 21 and 22. In the operation of component 10, the active zone 23 is configured, in particular, for generating electromagnetic radiation. In particular, the active zone 23 is a p-n junction zone.

For example, the semiconductor body 2 is based on a III-V or II-VI compound semiconductor material. The first semiconductor layer 21 and the second semiconductor layer 22 can each have one or a plurality of doped or undoped sub-layers. The first semiconductor layer 21 can be n-type or n-conducting and the second semiconductor layer 22 p-type or p-conducting, or vice versa. In particular, the semiconductor body 2 forms a diode structure with the first semiconductor layer 21, the active zone 23 and the second semiconductor layer 22.

The conversion layer 3 is arranged on the semiconductor body 2. In particular, the converter layer 3 is adjacent to the first semiconductor layer 21. The converter layer 3 is electrically conductive. For example, the converter layer 3 is in direct electrical contact with the semiconductor body 2, in particular with the first semiconductor layer 21. In particular, the converter layer 3 is configured for electrically contacting the first semiconductor layer 21 of the semiconductor body 2.

The component 10 has a front-side main surface 10F and a rear-side main surface 10R, facing away from the front-side main surface 10F. In a plan view of the front main surface 10F of the component 10, the converter layer 3 has a plurality of spatially separated sub-layers 30 (FIG. 1B). The sub-layers 30 of the converter layer 3 are laterally spaced apart and can be configured in such a way that they can be individually electrically contacted.

For example, the sub-layers 30 are each electrically conductively connected to a sub-region of a first electrode 4, in particular to a contact layer 41. Via the contact layers 41, which are in particular electrically insulated from each other, the sub-layers 30 of the converter layer 3 can be individually electrically conductively connected to an external voltage source. The contact layers 41 are, in particular, sub-regions 40 of the first electrode 4 of the component 10. According to figure I.A, the first electrode 4 is arranged with the sub-regions 40 or the contact layers 41 on the front main surface 10F of the component 10. The component has a second electrode 5, which is located, in particular, on the rear main surface 10R of the component 10. The component 10, in particular the semiconductor body 2, can be electrically contacted externally via the electrodes 4 and 5.

According to FIG. 1A, the component 10 has a carrier 1. In lateral directions, the semiconductor body 2 can be completely laterally enclosed by the carrier 1. The carrier 1 has a rear side 1R, which in some regions forms the rear main surface 10R of the component 10. The carrier 1 has a front side 1F opposite the rear side, wherein the front side 1F of the carrier 1 can form the front main surface 10F of the component 10 in some regions (FIG. 1B).

In particular, the contact layers 41 of the first electrode 4 are each designed as planar contact layers, which are arranged on the front side 1F of the carrier 1 and/or on the front main surface 10F of the component 10, in particular, exclusively on the front side 1F of the carrier 1 and/or on the front main surface 10F of the component 10. The contact layers 41 can each be in electrical contact with one of the sub-layers 30 of the converter layer 3, in particular in direct electrical contact. Along the vertical direction, some regions of the contact layer 41 can be arranged between the carrier 1 and the sub-layer 30. In a plan view of the front main surface 10F of the component, the contact layers 41 of the first electrode 4 and the semiconductor body 2 can be non-overlapping. The semiconductor body 2 has no regions that are covered by the contact layers 41 in a plan view.

According to FIGS. 1A and 1B, the sub-layers 30 of the converter layer 3 cover some regions of the semiconductor body 2 in a plan view of the front main surface 10F of the component 10. In a plan view of the front main surface 10F, the sub-layer 30 can cover the contact layer 41 and/or the carrier 1 in some regions. Each of the sub-layers 30 is, in particular, electrically conductively connected to exactly one of the contact layers 41, and vice versa, so that the sub-layers 30 of the converter layer 3 are designed to be individually electrically contactable via the separate contact layers 41 of the first electrode 4.

Due to the partial coverage of the semiconductor body 2 by the sub-layers 30 of the converter layer 3, the semiconductor body 2 has sub-regions 2A, which are covered by the sub-layer 30 or sub-layers 30, and at least one sub-region 21, which is left uncovered by the sub-layers 30 of the converter layer 3. The covered sub-region 2A of the semiconductor body 2 includes in particular a covered sub-region 21A of the first semiconductor layer 21 and a covered sub-region 23A of the active zone 23.

The uncovered sub-region 21 of the semiconductor body 2 includes, for example, an uncovered sub-region 21I of the first semiconductor layer 21 and an uncovered sub-region 23I of the active zone 23. In the operation of the component 10, charge carriers are injected via the sub-layers 30 into the covered sub-region 21A or into the covered sub-regions 21A of the first semiconductor layer 21, whereas the uncovered sub-region 21I of the first semiconductor layer 21 remains electrically isolated from the sub-layers 30 of the converter layer 3 due to the comparatively poor cross-conductivity of the semiconductor body 2, in particular the first semiconductor layer 21. In other words, due to the structuring of the converter layer 3 and, in particular, due to the absence of an in particular contiguous current spreading layer, hardly any charge carriers or none at all are injected into the uncovered sub-region 21I or into the uncovered sub-regions 21I of the first semiconductor layer 21.

The uncovered sub-region 23I of the active zone 23, located underneath the uncovered sub-region 21I of the first semiconductor layer 21, thus forms a radiation-inactive sub-region 23I of the active zone 23. In contrast, the sub-regions 23A of the active zone 23 which are covered by the sub-layers 30 can form radiation-active sub-regions 23A of the active zone 23. Depending on the electrical contacting of the sub-layers 30, specific positions of the semiconductor body 2 can be caused to emit light. The sub-layers 30 of the converter layer 3 are thus configured, in particular, for the local electrical contacting of the semiconductor body 2, in particular the active zone 23 and/or the first semiconductor layer 21.

The sub-regions 23I of the active zone 23 which are not covered by a sub-layer 30 of the converter layer 3 do not generate electromagnetic radiation during the operation of the component 10. Only the covered sub-regions 23A of the active zone 23 are designated for generating electromagnetic radiation. In particular, the charge carriers are only injected into the regions of the semiconductor body designated for generating electromagnetic radiation. The sub-layers 30 of the converter layer 3 thus define the radiation exit points of the component 10. A leakage of short-wave radiation, which could lead to unwanted escape of UV radiation or blue light, can thus be prevented in a pre-emptive way.

Each of the covered sub-regions 2A of the semiconductor body 2, together with the corresponding sub-layer 30 of the converter layer 3, can form a pixel P of the component 10. In plan view, the adjacent pixels P of the component 10 are separated from each other by the uncovered sub-region 21 or the uncovered sub-regions 21 of the semiconductor body 2. It is possible that the semiconductor body 2 has a single contiguous uncovered sub-region 21. It is also possible that the single contiguous uncovered sub-region 21 borders all covered sub-regions 2A of the semiconductor body 2 and is thus adjacent to all pixels P of the component 10, in particular directly.

The second electrode 5 can be arranged or electrically contactable on the rear side 1R of the carrier 1 or on the rear main surface 10R of the component 10. The second electrode 5 can be configured as a common electrode for the entire semiconductor body 2, or for the entire second semiconductor layer 22. In a plan view of the rear main surface 10R of the component 10, the second electrode 5 can completely cover the semiconductor body 2. For example, the second electrode 5 is designed to reflect radiation. The second electrode 5 can be made of a metal, such as silver, aluminum or copper. In particular, the second electrode 5 is accessible exclusively from the rear main surface 10R of the component 10.

For example, contact layers 41 of the first electrode 4, which are designed in particular as planar contacting layers of the component 10, are accessible exclusively from the front main surface 10F of the component 10. The carrier 1 can have conductor tracks that are electrically conductively connected to the first electrode 4 and/or to the second electrode 5 of the component 10.

The converter layer 3 with the sub-layers 30 is conveniently designed to be electrically conductive. In particular, the converter layer 3 or the sub-layer 30 has an electrically conductive matrix material 3M. The electrically conductive matrix material 3M is a radiation-permeable and electrically conductive material, in particular. For example, the electrically conductive matrix material is a transparent, electrically conductive metal oxide or includes particles, in particular nanoparticles, of a transparent, electrically conductive oxide. It is also possible that the 3M matrix material includes a silicone in which electrically conductive particles are embedded, made of metal and/or of a transparent electrically conductive oxide, for example.

The converter layer 3 has fluorescent particles 3L embedded in the matrix material 3M. The sub-layers 30 of the converter layer 3 may include the same electrically conductive matrix material. The sub-layers 30 of the converter layer 3 may also include the same or different fluorescent compositions. Each of the sub-layers 30 can be formed as a single piece and can be electrically insulated from the other sub-layers 30 of the converter layer 3.

Figure 3A:
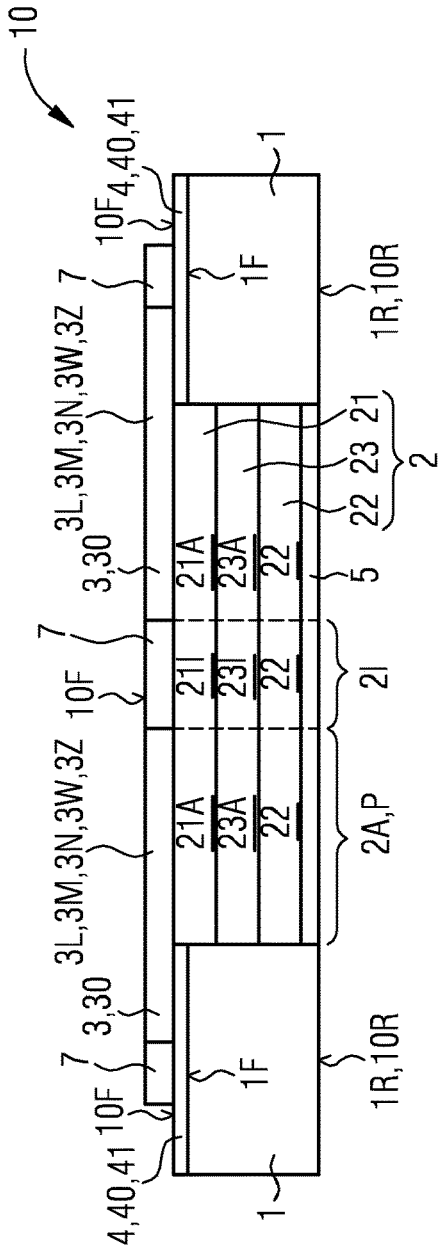
FIGS. 3A, 3B and 3C show further embodiments of other components in sectional views.
Figure 3B:
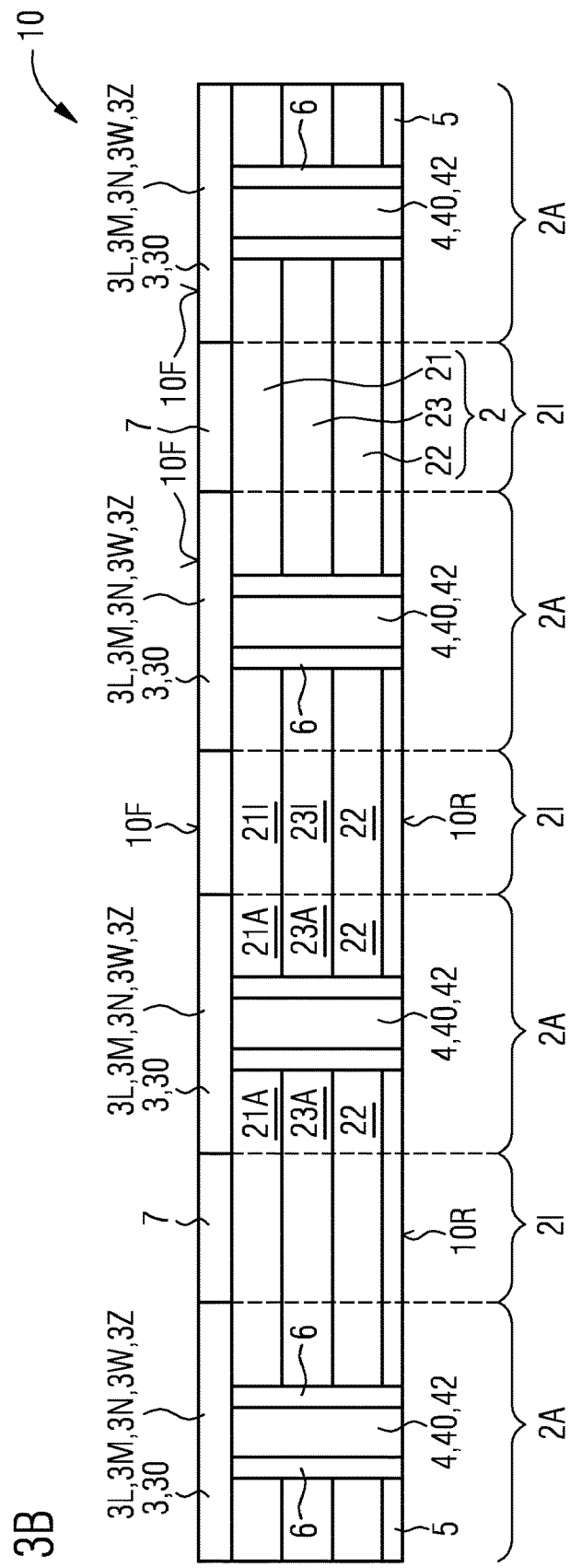

According to FIG. 3B, the converter layer 3 can have at least three sub-layers 30, in particular with different types of fluorescent particles 3L and/or with different fluorescent compositions, wherein the at least three sub-layers 30 partially cover the same semiconductor body 2, in particular the same active zone 23, in plan view. The covered sub-regions 2A of the semiconductor body 2 together with one of the sub-layers 30 each form one pixel P of the component 10. The component 10 can have a pixel group PG, which includes a plurality of pixels P. For example, the pixel group PG forms an RGB pixel group, which is shown schematically in FIG. 1B, for example. According to FIG. 1B, the front main surface 10F of the component 10 can be formed by surfaces of the first electrode 4, the carrier 1, the converter layer 3 and/or the uncovered sub-region 21 of the semiconductor body 2.

In addition to the fluorescent particles 3L, the converter layer 3 or the sub-layer 30 can have metallic additive particles 3Z, which are embedded in the matrix material 3M, in particular to increase the electrical conductivity of the converter layer 3. Alternatively or in addition, the converter layer 3 or the sub-layer 30 can have organic or inorganic additive particles 3W, which are embedded in the matrix material 3M, for example to reduce internal mechanical stresses in the converter layer 3. Furthermore, as an alternative or additionally, the converter layer 3 or the sub-layer 30 can have additional particles 3N, which are embedded in the matrix material 3M, for example to adjust the degree of reflectivity and/or permeability of the converter layer 3. Such additional particles 3N can be formed by radiation-reflecting particles made from titanium oxide, for example.

FIG. 1B shows only three sub-layers 30 of the converter layer 3. In a variation of this, it is possible for the converter layer 3 to have more than three sub-layers 30, for example at least 10, 20, 50, 100 or at least 1000 sub-layers 30.

Figure 1C:
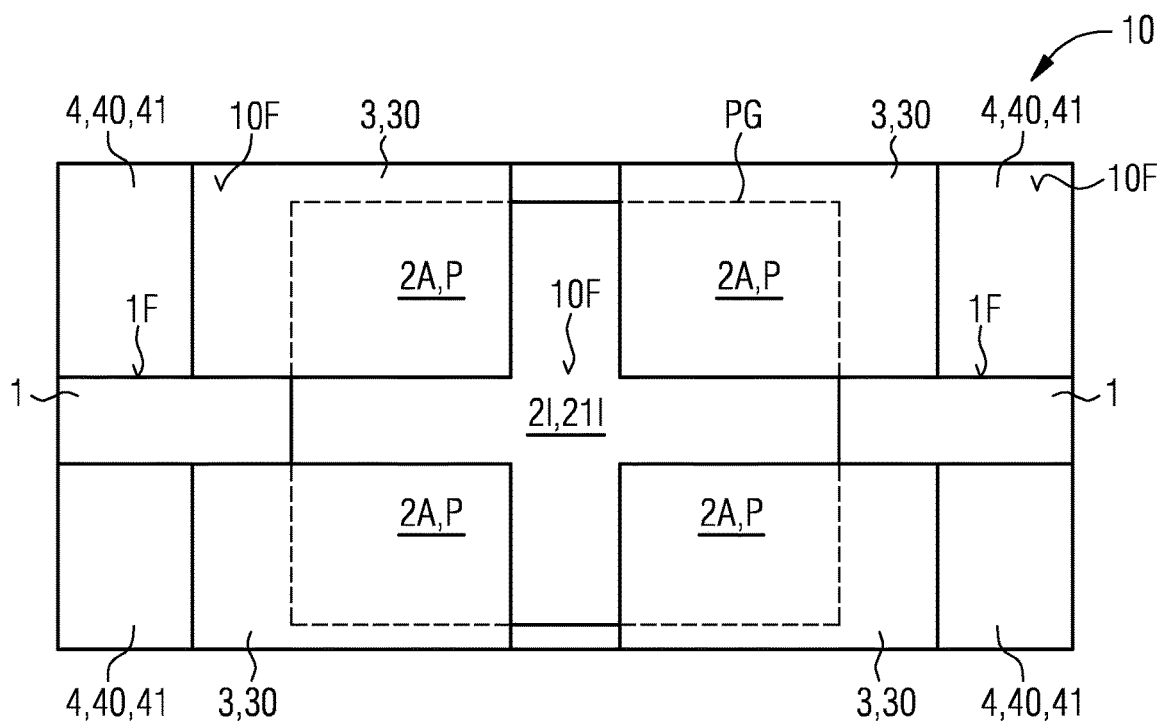
FIG. 1C shows a further embodiment of a component in a plan view of a front side of the component.

The embodiment shown in FIG. 1C corresponds essentially to the embodiment of a component 10 illustrated in FIG. 1B. In contrast to the latter, in this case four sub-layers 30 rather than three sub-layers 30 are assigned to a pixel group PG. In particular, such a pixel group is a CMYK pixel group. In a variation of FIG. 3C, it is possible that the converter layer 3 has more than four sub-layers 30, for example at least 10, 20, 50, 100 or at least 1000 sub-layers 30.

The embodiment shown in FIG. 2A corresponds essentially to the embodiment of a component 10 illustrated in FIG. 1A. In contrast to the latter, the carrier 1 is not shown in FIG. 2A. It is possible that a component 10 as shown in FIG. 2A lacks such a carrier 1, which in particular completely encloses the semiconductor body 2. The second electrode 5 can be made sufficiently thick that it is forms a carrier or at least a temporary carrier of the component 10.

In further contrast to FIG. 1A, both the first electrode 4 and the second electrode 5 are accessible on the rear main surface 10R of the component 10. The laterally spaced apart sub-regions 40 of the electrode 4 are each formed as vias 42 of the first electrode 4. The via 42 extends along the vertical direction, in particular through the second electrode 5 and the semiconductor body 2, as far as one of the sub-layers 30 of the converter layer 3. In particular, the via 42 and the associated sub-layer 30 are in direct electrical contact. Each of the sub-layers 30 of the converter layer 3 can be electrically contacted externally by a via 42 on the rear main surface 10R of the component 10. Apart from the sub-layers 30 of the converter layer 3, the component 10 is, in particular, free of further electrically conductive layers, such as further contact layers or current spreading layers, on the front main surface 10F. Analogous to FIG. 1A, a component 10 designed in accordance with FIG. 2A can be free of bonding wires or bonding connections on the front main surface 10F, which could lead to shadowing effects. According to FIG. 2A, the component 10 can be free of planar contacting layers, such as on the front main surface 10F.

The via 42 thus extends through the second semiconductor layer 42, the active zone 23 and the first semiconductor layer 21 as far as a sub-layer 30 of the converter layer 3. In lateral directions, the via 42 is completely enclosed by the semiconductor body 2 and/or by an insulation layer 6. The via 42 is electrically conductively connected in particular to the first semiconductor layer 21 via the associated sub-layer 30. In particular, there is no direct electrical or physical contact between the semiconductor body 2 and the via 42.

According to FIG. 1A, the sub-layer 30 or the plurality of sub-layers 30 extends laterally beyond the semiconductor body 2. In a plan view of the front main surface 10F of the component 10, all sub-layers 30 of the converter layer 3 according to FIG. 2A are located, in particular exclusively, within the extension region of the semiconductor body 2. In some cases, apart from the positions of the via 42, the sub-layers 30 may overlap the semiconductor body 2, in particular completely.

Due to the arrangement of the sub-layers 30 or the structured converter layer 3, the semiconductor body 2 is divided into a plurality of covered sub-regions 2A and into a sub-region 21 or into a plurality of uncovered sub-regions 21. The covered sub-regions 2A form the radiation-active sub-regions 2A of the semiconductor body 2, wherein the uncovered sub-region 21 forms a radiation-inactive sub-region 21 of the semiconductor body 2.

Figure 2B:
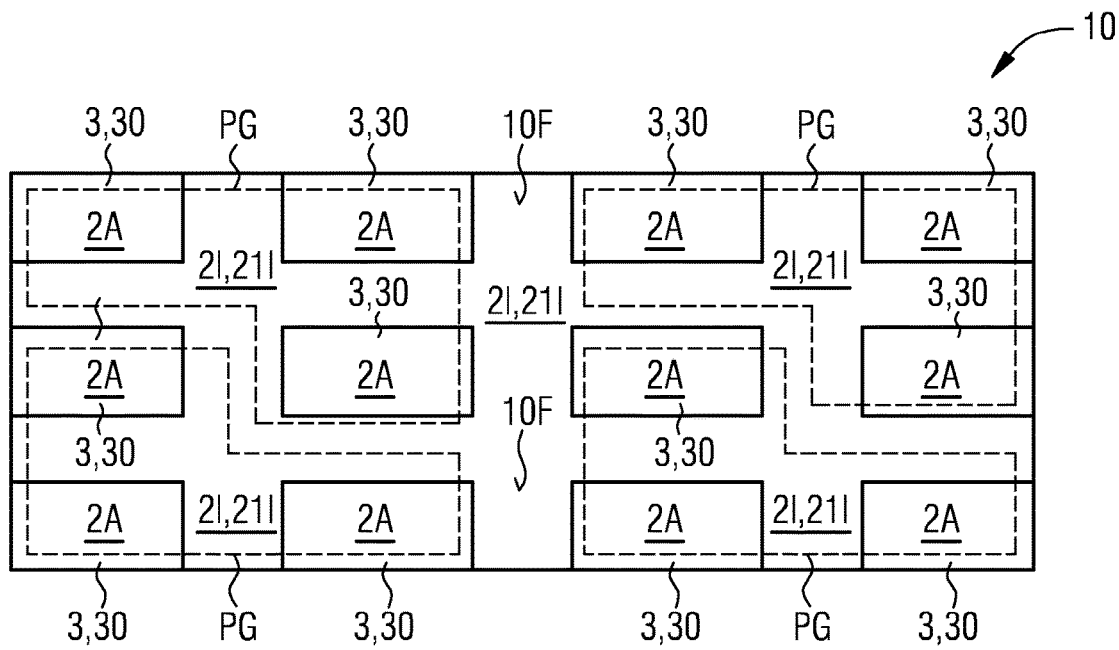
Figure 3C:
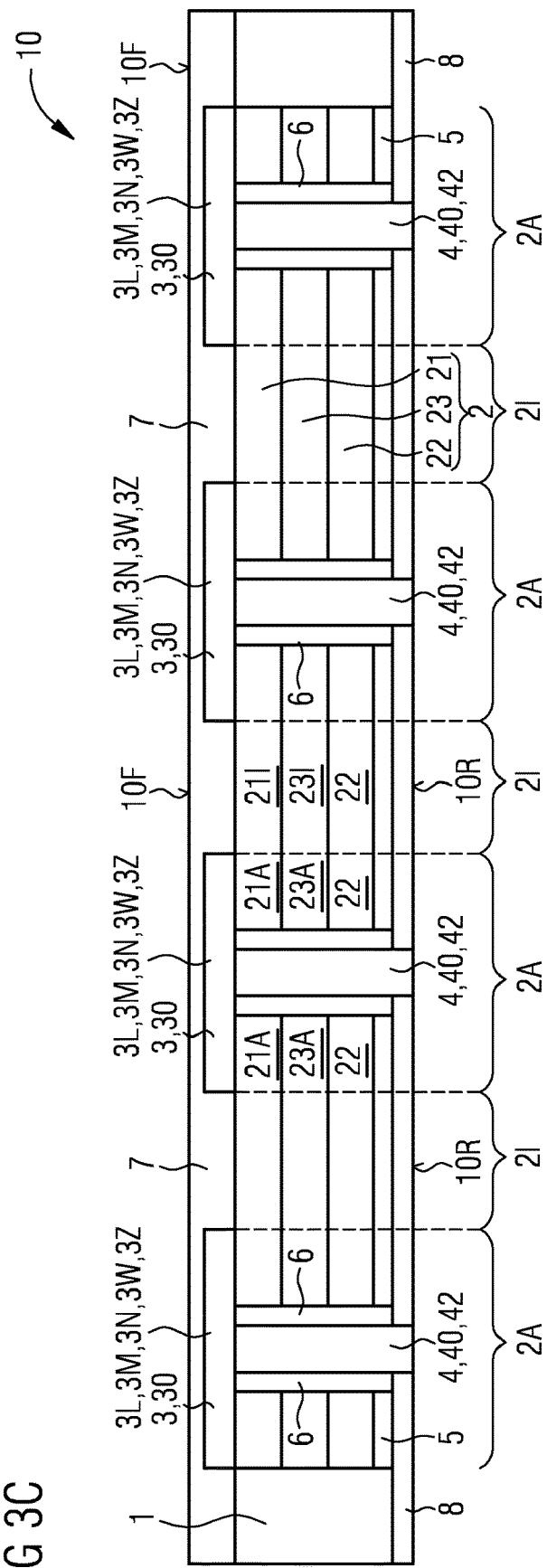

In FIG. 2B, the component 10 is schematically illustrated in a plan view of the front main surface 10F. The component 10 has a plurality of pixel groups PG. The front main surface 10F of the component 10 is formed, in particular exclusively, by surfaces of the sub-layers 30 and the uncovered sub-region 21 of the semiconductor body 2. In a variation of this, it is possible for the component to have a protective layer 7, which is illustrated in FIG. 3B or 3C, for example. In this case, the front main surface 10F of the component 10 may be formed partially or exclusively by a surface of the protective layer 7 or exclusively by surfaces of the converter layer 3 and of the protective layer 7. The protective layer 7 can completely cover the uncovered sub-region 21 or the plurality of uncovered sub-regions 21 and/or the sub-layers 30 of the converter layer 3. In particular, the protective layer 7 is made of a radiation-permeable and electrically insulating material.

Figure 2C:
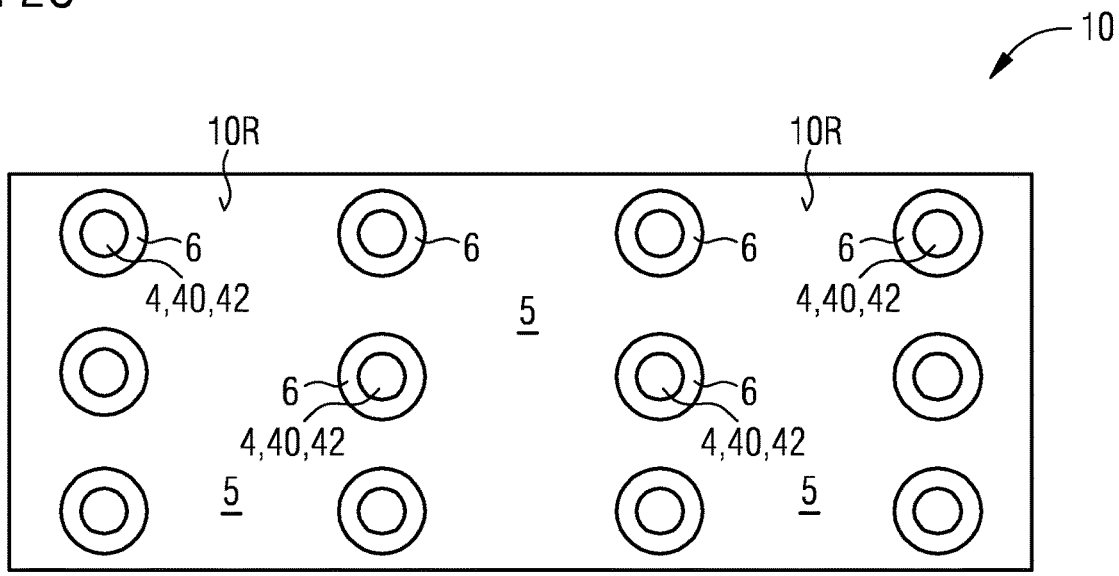

In FIG. 2C, the component 10 is illustrated in a plan view of the rear main surface 10R. Both the first electrode 4 with the vias 42, and the second electrode 5 can be electrically contacted on the rear main surface 10R. The vias 42 are each completely surrounded laterally by an insulation layer 6 and are therefore electrically insulated from the second electrode 5. The vias 42 can be individually electrically contacted. In particular, each of the vias 42 is assigned to one of the sub-layers 30, and vice versa.

The embodiment of a component 10 illustrated in FIG. 3A corresponds essentially to the embodiment of a component 10 illustrated in FIG. 1A. In contrast to the latter, the component 10 has a protective layer 7. The protective layer 7, in plan view, covers the uncovered sub-region 21 or the plurality of uncovered sub-regions 21 of the semiconductor body 2, in particular completely. The protective layer 7 can be directly adjacent to the sub-layers 30 of the converter layer 3 and/or to the semiconductor body 2. In a plan view of the front main surface 10F, the protective layer 7 can cover the first electrode 4, in particular the contact layers 41, in some regions. It is possible that the protective layer 7 completely covers the converter layer 3 in plan view, in particular all sub-layers 30 of the converter layer 3.

Analogous to FIG. 3A, the embodiment shown in FIG. 3B essentially corresponds to the embodiment of a component 10 illustrated in FIG. 2A, but with the protective layer 7.

The embodiment shown in FIG. 3C corresponds essentially to the embodiment of a component 10 illustrated in FIG. 3B. In contrast to the latter, FIG. 3C also shows the carrier 1. The carrier 1 shown in FIG. 3C corresponds essentially to the carrier 1 illustrated in FIG. 1A. In plan view, the protective layer 7 can completely cover the carrier 1, the semiconductor body 2 and/or the converter layer 3. According to FIG. 3C, the component 10 has an additional insulation layer 8, which covers, in particular completely covers, the carrier 1 and/or the second electrode 5 and/or the semiconductor body 2. The vias 42 of the first electrode 4 can each extend through the additional insulation layer 8. The rear main surface 10R of the component 10 can be formed in some regions by surfaces of the additional insulation layer 8. The additional insulation layer 8 is used in particular to provide the electrical insulation between the first electrode 4 and the second electrode 5.

Figure 4A:
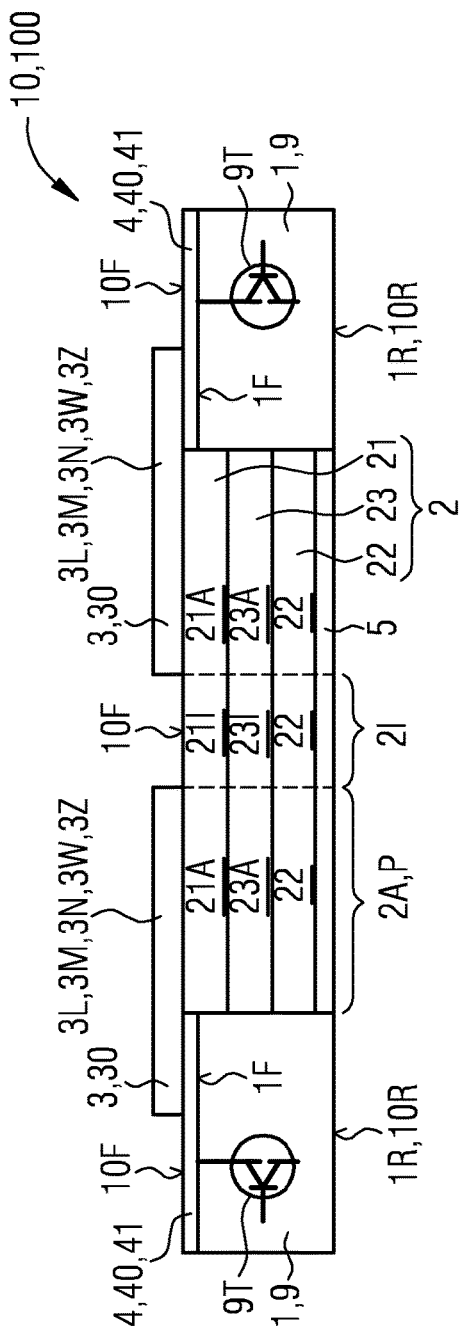

In FIG. 4A, the component 10 or a display device 100 with the component 10 is shown schematically. The embodiment shown in FIG. 4A corresponds essentially to the embodiment shown in FIG. 1A. In contrast to the latter, the component 10 or the display device 100 has a plurality of transistors 9T. The transistors 9T are each electrically conductively connected to one of the contact layers 41. The transistors 9T can be used to selectively control the electrical contacting of the sub-layers 30 or the radiation-active sub-regions 23A of the active zone 23.

The transistors 9T can be integrated in the carrier 1 of the component 10. The carrier 1 of the component 10 can be designed as a carrier 9 of the display device 100. In this case, the transistors 9T are integrated in the carrier 9 of the display device 100.

Figure 4B:
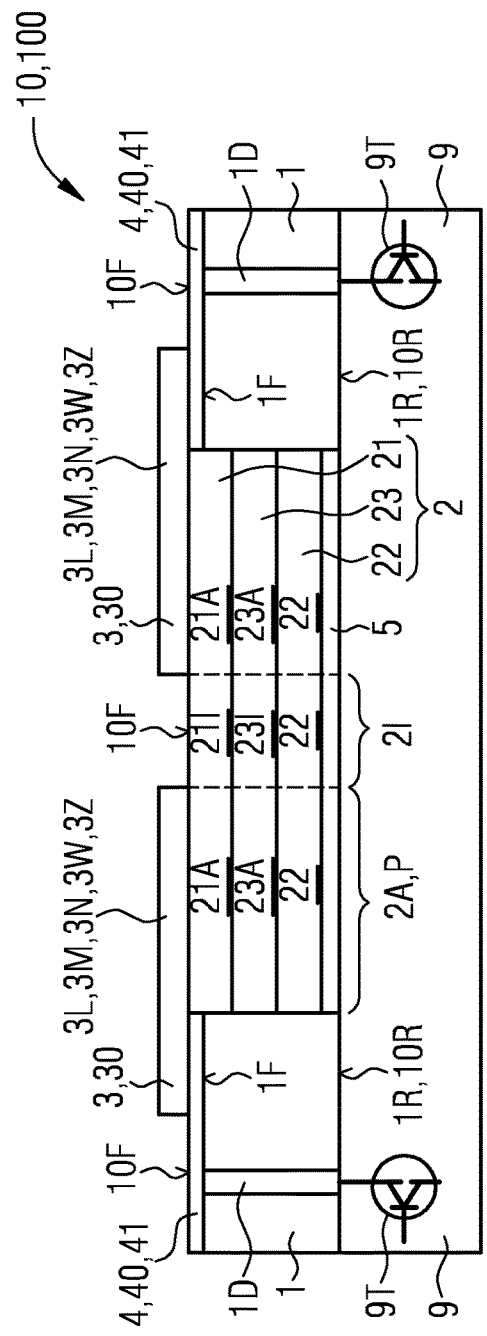

The embodiment shown in FIG. 4B corresponds essentially to the embodiment of a component 10 or of a display device 10, illustrated in FIG. 4A. In contrast to the latter, the component 10 or the display device 100 has another carrier 9 in addition to the carrier 1. The component 10 is arranged, in particular, on the carrier 9 of the display device 100. The transistors 9T can be embedded or integrated in the carrier 9 of the display device 100. The carrier 1 of the component 10 may have a via 1D or a plurality of vias 1D, the via 1D extending through the carrier 1 along the vertical direction. The via 1D is electrically conductively connected, in particular, to one of the contact layers 41 of the first electrode 4. The transistors 9T can be embedded or integrated in the carrier 9 of the display device 100. By means of the vias 1D, the transistors 9T can each be electrically conductively connected to one of the sub-layers 30 of the converter layer 3.

The embodiment of a component 10 or a display device 10 shown in FIG. 4C corresponds essentially to the embodiment of a component 10 or of a display device 10 illustrated in FIG. 3A. In contrast to the latter, the component 10 or the display device 100 has an additional carrier 9. The carrier 9 shown in FIG. 4C can be designed in an analogous way to the carrier 9 illustrated in FIG. 4B. By means of the vias 42 of the first electrode, the transistors 9T can each be electrically conductively connected to one of the sub-layers 30 of the converter layer 3. Unlike in FIG. 4C, it is possible that the component 10 or the display device 100 lacks a carrier 1. The additional carrier 9 with the transistors 9T can be designed as the only carrier of the component 10 or of the display device.

This patent application claims the priority of the German patent application 10 2018 104 993.5, the disclosed content of which is hereby incorporated by reference.

The invention is not limited to the embodiments by the fact that the description of the invention is based on them. Rather, the invention includes each new feature, as well as any combination of features, which includes in particular any combination of features in the patent claims, even if this feature or this combination itself is not explicitly specified in the patent claims or embodiments.

LIST OF REFERENCE SIGNS

100 display device
10 component
10F front main surface of the component
10R rear main surface of the component 1 carrier/carrier of the component
1D via
1F front side of the carrier
1R rear side of the carrier
2 semiconductor body
2A covered sub-region of the semiconductor body
2I uncovered sub-region of the semiconductor body
21 first semiconductor layer
22 second semiconductor layer
23 active zone
23A radiation-active subregions of the active zone
23I radiation-inactive sub-region of the active zone
3 converter layer
30 sub-layer of the converter layer
3L fluorescent particles
3M matrix material
3N additional particles
3W organic and/or inorganic additive particles
3Z metallic additive particles
4 first electrode
40 sub-region of the first electrode
41 first electrode contact layer
42 via of the first electrode
5 second electrode
6 insulation layer
7 protective layer
8 additional insulation layer
9 carrier/carrier of the display device
9T transistor
P pixel
PG pixel group

The invention claimed is:

1. A component comprising:
a semiconductor body;
a converter layer arranged on the semiconductor body; wherein the converter layer is divided into a plurality of spatially separated sub-layers capable of being individually electrically contacted, wherein each sub-layer of the converter layer is electrically insulated from the other sub-layers of the converter layer; wherein each sub-layer of the converter layer comprises:
fluorescent particles, and an electrically conductive matrix material, wherein the fluorescent particles are embedded in the matrix material; and
the semiconductor body has an active zone for generating electromagnetic radiation, wherein the spatially separated sub-layers of the converter layer are configured for the local electrical contacting of the active zone; and
a first electrode on its front main surface and a second common electrode on its rear main surface, wherein the first electrode having a plurality of planar individual contact layers, each of the planar individual contact layers being connected in an electrically conductive manner to one of the sub-layers of the converter layer.

2. The component as claimed in claim 1,
wherein a current spreading layer is absent between the converter layer and the semiconductor body.

3. The component as claimed in claim 1,
wherein the converter layer is arranged directly on the semiconductor body.

4. The component as claimed in claim 1,
wherein the converter layer has at least three sub-layers with different types of fluorescent particles or with different fluorescent substance compositions, wherein the at least three sub-layers partially cover the same active zone of the semiconductor body in plan view.

5. The component as claimed in claim 1,
wherein the fluorescent particles have an average particle size ranging from 1 nm to 1 µm inclusive.

6. The component as claimed in claim 1,
wherein the fluorescent particles are quantum dots having an average particle size ranging from 1 nm to 10 nm inclusive.

7. The component as claimed in claim 1,
wherein in the operation of the component, the active zone has at least one radiation-inactive sub-region and a plurality of radiation-active sub-regions, wherein in plan view of the semiconductor body
the converter layer and the radiation-inactive sub-region do not overlap, and
the radiation-active sub-regions are covered by the sub-layers of the converter layer.

8. The component as claimed in claim 7,
wherein the radiation-inactive sub-region and the radiation-active sub-regions are adjacent regions of the same coherently formed active zone of the semiconductor body.

9. The component as claimed in claim 1,
wherein the matrix material has a radiation-permeable and electrically conductive oxide.

10. The component as claimed in claim 1,
wherein the converter layer has metallic additive particles embedded in the matrix material to increase the electrical conductivity of the converter layer.

11. The component as claimed in claim 1,
wherein the converter layer has organic or inorganic additive particles embedded in the matrix material to reduce internal mechanical stresses in the converter layer.

12. The component as claimed in claim 1,
wherein the converter layer has additional particles embedded in the matrix material for adjusting the degree of reflection and/or permeability of the converter layer, the additional particles being formed of a material with a refractive index greater than a refractive index of the matrix material.

13. The component as claimed in claim 12,
wherein the additional particles are nanoparticles of titanium oxide and/or zirconium oxide.

14. The component as claimed in claim 1,
further comprising a first electrode and a second electrode on its main surface facing away from the converter layer, the first electrode having a plurality of vias extending in each case from the main surface through the second electrode and the semiconductor body to one of the sub-layers of the converter layer.

15. A display device having the component as claimed in claim 1,
wherein a sub-region of the semiconductor body and a group of at least three sub-layers of the converter layer form a pixel group of the display device to display any chromaticity coordinate, and
wherein a further sub-region of the semiconductor body and a further group of at least three additional sub-layers of the converter layer form an additional pixel group of the display device for displaying any chromaticity coordinate, wherein the sub-region and the further sub-region of the semiconductor body are designed in a contiguous manner.

16. A method for producing a component as claimed in claim 1,
wherein the method comprises producing the converter layer by a sol-gel process.

17. A component comprising:
a semiconductor body;
a converter layer arranged on the semiconductor body; wherein the converter layer is divided into a plurality of spatially separated sub-layers capable of being individually electrically contacted, wherein each sub-layer of the converter layer is electrically insulated from the other sub-layers of the converter layer; wherein each sub-layer of the converter layer comprises:
fluorescent particles, and an electrically conductive matrix material, wherein the fluorescent particles are embedded in the matrix material; and
the semiconductor body has an active zone for generating electromagnetic radiation,
wherein the spatially separated sub-layers of the converter layer are configured for the local electrical contacting of the active zone;
a first electrode and a second electrode on its main surface facing away from the converter layer, the first electrode having a plurality of vias extending in each case from the main surface through the second electrode and the semiconductor body to directly contact one of the sub-layers of the converter layer.

* * * * *

UNITED STATES PATENT AND TRADEMARK OFFICE
CERTIFICATE OF CORRECTION

| | | |
|---|---|---|
| PATENT NO. | : 11,605,667 B2 | Page 1 of 1 |
| APPLICATION NO. | : 16/977815 | |
| DATED | : March 14, 2023 | |
| INVENTOR(S) | : Vesna Mueller and David O'Brien | |

It is certified that error appears in the above-identified patent and that said Letters Patent is hereby corrected as shown below:

On the Title Page

Item (30) should read as below:
(30) Foreign Application Priority Data
Mar. 5, 2018 (DE) ... 10 2018 104 993.5

Signed and Sealed this
Sixteenth Day of May, 2023

Katherine Kelly Vidal
*Director of the United States Patent and Trademark Office*